United States Patent [19]

Hasegawa et al.

[11] 4,218,270
[45] Aug. 19, 1980

[54] METHOD OF FABRICATING ELECTROLUMINESCENT ELEMENT UTILIZING MULTI-STAGE EPITAXIAL DEPOSITION AND SUBSTRATE REMOVAL TECHNIQUES

[75] Inventors: Shinichi Hasegawa; Hisanori Fujita, both of Tsughiura, Japan

[73] Assignee: Mitsubishi Monsanto Chemical Company, Tokyo, Japan

[21] Appl. No.: 853,957

[22] Filed: Nov. 22, 1977

[30] Foreign Application Priority Data

Nov. 22, 1976 [JP] Japan ............................. 51-140443
Nov. 26, 1976 [JP] Japan ............................. 51-141959

[51] Int. Cl.² .................. H01L 21/20; H01L 21/302
[52] U.S. Cl. ................................. 148/175; 29/580; 29/583; 148/1.5; 357/16; 357/17; 357/30; 357/65
[58] Field of Search ............... 29/580, 583, 569 L, 29/576 E; 148/1.5, 175; 357/16, 17, 30, 65

[56] References Cited

U.S. PATENT DOCUMENTS

| | | | |
|---|---|---|---|
| 3,089,794 | 5/1963 | Marinace | 148/175 X |
| 3,508,126 | 4/1970 | Newman et al. | 148/175 X |
| 3,634,872 | 1/1972 | Umeda | 357/30 |
| 3,647,581 | 3/1972 | Mash | 148/175 |
| 3,745,423 | 7/1973 | Kasano | 357/17 |
| 3,873,382 | 3/1975 | Groves et al. | 148/175 |
| 4,000,020 | 12/1976 | Gartman | 148/175 |

OTHER PUBLICATIONS

Herzog et al, "Electroluminescence . . . GaAsP Diodes . . . " J. Applied Physics, vol. 40, No. 4, Mar. 15, 1969, pp. 1830–1838.
Blakeslee et al, "Receiving Resistance in PN Junctions Using GaAsP" I.B.M. Tech. Disc. Bull, vol. 15, No. 4, Sep. 1972, p. 1284.

*Primary Examiner*—L. Dewayne Rutledge
*Assistant Examiner*—W. G. Saba
*Attorney, Agent, or Firm*—Sughrue, Rothwell, Mion, Zinn and Macpeak

[57] ABSTRACT

An epitaxial layer of a photoelectric element, which is formed on a substrate and in which a p-n junction is formed has a high carrier density region adjacent the substrate, so that the provision of ohmic electrodes thereon is facilitated.

8 Claims, 1 Drawing Figure

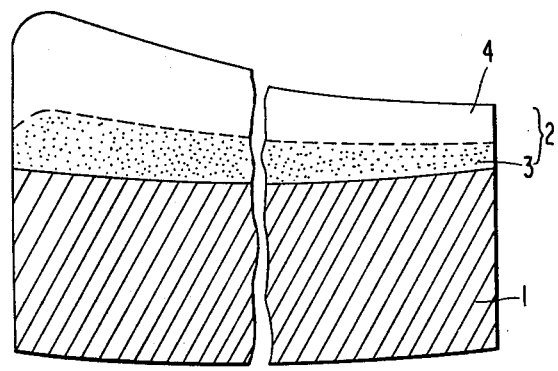

METHOD OF FABRICATING ELECTROLUMINESCENT ELEMENT UTILIZING MULTI-STAGE EPITAXIAL DEPOSITION AND SUBSTRATE REMOVAL TECHNIQUES

BACKGROUND OF THE INVENTION

The present invention relates to an electroluminescent wafer and a method of fabricating the same and, particularly, to an electroluminescent wafer having an epitaxial layer of a compound semiconductor material consisting of elements belonging to groups IIIb and Vb of periodical table (hereinafter, referred to as III–V semiconductor) and a method of fabricating the same electroluminescent wafer.

A thin layer of III–V semiconductor provided on a substrate by an epitaxial growth has been used in fabricating semiconductor devices such as a light emitting diode (hereinafter referred to as LED). It has been known, however, that III–V semiconductor material generally have a high index of refraction and, therefore, a substantial portion of light emitted from the p-n junction of an LED provided with an epitaxial layer of III–V semiconductor may be fully reflected at an interface provided by a surface of the layer. In this case, when a substrate on which the epitaxial layer is deposited is of monocrystalline material exhibiting a poor light transparency, most of the light emitted may be absorbed within the substrate of the LED.

For example, the index of refraction of gallium arsenide phosphide ($GaAs_{(1-x)}P_x$, $x=0.4$) is about 3.6 and the total reflection angle thereof is about 16°. Therefore, in an LED comprises a substrate of gallium arsenide having poor light transparency and an epitaxial layer of gallium arsenide phosphide deposited thereon, the percentage of the total amount of light which is emitted from the p-n junction thereof and which can be used, is very small and generally 3 to 4% of the total light emitted.

Further, if the substrate is of a III–V semiconductor different from that forming the epitaxial layer or of a semiconductor consisting of an element such as germanium (Ge) belonging to group IV of the periodic table, the epitaxial wafer obtained may possibly be warped because of differences in properties of material such as crystallographic lattice constant between the substrate and the epitaxial layer.

In order to provide ohmic electrode on the substrate side of the wafer, it is usual to polish the wafer to facilitate the provision of electrodes. With a curved epitaxial wafer, there is a possibility that the inner surface of the epitaxial layer will be locally exposed by the polishing.

It is generally difficult to form electrodes directly on a polished surface of a low carrier density epitaxial layer suitable to form a p-n junction. This disadvantage may become serious when a curved wafer is used to produce LEDs or when a substrate having poor light transparency, which will be removed, after the epitaxial layer is formed, to increase the amount of usable light, is used to form the wafer.

That is, in either of the above cases, the yield of LEDs may be significantly decreased due to the difficulty of forming ohmic electrodes on the low carrier density layer.

SUMMARY OF THE INVENTION

The present inventors have found that the defects of the conventional method can be removed by making the carrier density of only a portion of the epitaxial layer adjacent the substrate high enough to form electrode thereon.

Accordingly, an object of the present invention is to facilitate a provision of ohmic electrodes on an epitaxial layer of an electroluminescent wafer.

Another object of the present invention is to provide an improved electroluminescent wafer from which high efficiency LEDs may be produced.

Another object of the present invention is to provide an LED from which an increased amount of light can be led out.

Another object of the present invention is to provide an improved method of fabricating a photoelectric element in which the yield of LEDs is much improved.

The above objects are achieved, according to the present invention, by epitaxially growing a layer of a compound semiconductor consisting of elements belonging to groups IIIb and Vb of the periodic table on a substrate of a monocrystalline compound semiconductor consisting of elements belonging to groups IIIb and Vb of periodic table or of a monocrystalline compound semiconductor consisting of an element belonging to group IV of the periodic table so that a region of an epitaxial layer adjacent the substrate has a high carrier density and other regions of the epitaxial layer have low carrier density.

BRIEF DESCRIPTION OF THE DRAWING

A single Figure shows a cross section of an epitaxial wafer of III–V semiconductor provided on a substrate of monocrystalline III–V semiconductor or monocrystalline IV semiconductor.

DETAILED DESCRIPTION OF THE PREFERRED EMBODIMENT

In FIG. 1, on a monocrystalline substrate 1 of a semiconductor consisting of elements belonging to groups III and V of the periodic table or to group IV of the periodic table, an epitaxial layer 2 is formed. In this embodiment, the material of the layer 2 is of a III–V semiconductor different from that of the substrate. The drawing illustrates in exaggeration a warped wafer due to the difference in physical properties between the substrate and the epitaxial layer. In order to compensate for the difference, a region 3 of the epitaxial layer 2 adjacent to the substrate 1 serves as a compositionally gradient layer to make the epitaxial layer 2 continuous in properties to the substrate 1, so that the distortion due to the difference in the crystallographic lattice constant of the epitaxial layer is minimized. It should be noted that when the material of the substrate is the same as that of the epitaxial layer 2, the gradient region 3 may be unnecessary.

As monocrystalline substrate material, III–V semiconductor such as gallium arsenide (GaAs), gallium antimonide (GaSb), indium arsenide (InAs), indium antimonide (InSb), or IV semiconductors such as germanium (Ge), silicon (Si) etc. which are inexpensive and have poor or no light transparency are usable. Although gallium phosphide (GaP) exhibiting a good light transparency can also be used as the material of the monocrystalline substrate as a matter of course, it is economically difficult to employ as the substrate material.

The crystallographic plane of the substrate to be used for the epitaxial growth is usually {100}. However other planes such as {111} may also be used for this purpose.

The epitaxial growth of the layer 2 may be obtained by the conventional method using an epitaxial reaction apparatus capable of adjusting the supply rate of dopant.

For example, in the case where epitaxial layer 2 of gallium arsenide phosphide (GaAs$_{(1-x)}$Px, x=0.4) for a red light emission is deposited on the substrate 1 of gallium arsenide (GaAs), the compositionally gradient layer 3 may be of gallium arsenide phosphide (GaAs$_{(1-x)}$Px), with the mixed crystal ratio x being varied continuously from 0 to 0.4 in thickness direction of the layer 3.

As the dopant, sulfur, zinc, silicon, etc. may be used. In case the dopant is sulfur, it may be used in the form of hydrogen sulfide (H$_2$S).

The carrier density of a starting region of the epitaxial layer 2, which may be the region 3, may be $9 \times 10^{16}$ atoms/ml or more and preferably $3 \times 10^{17}$ atoms/ml or more. This portion of the epitaxial layer 2 is used as an electrode forming layer in the LED manufacturing process. The thickness of the epitaxial layer 2 should be 100 μm or more and, preferably, 200 μm or more.

Subsequent to the formation of the initial high carrier density epitaxial region, an epitaxial layer region 4 having a carrier density in a range between $9 \times 10^{15}$ and $3 \times 10^{17}$ atoms/ml, and preferably between $2 \times 10^{16}$ and $9 \times 10^{16}$ atoms/ml, is formed continuously thereon. In the latter epitaxial layer region 4, a p-n punction is to be formed.

As the III-V semiconductor material to be used to form the epitaxial layer 2, gallium phosphide, gallium arsenide, gallium arsenide phosphide (GaAs$_x$P$_{(1-x)}$, 0<x<1), indium antimonide (InSb) etc. are exemplified. It should be noted, however, that other III-V semiconductor materials than the above mentioned can also be used for the same purpose.

Since the epitaxial wafer formed according to the present invention has a epitaxial layer 2 of high carrier density adjacent the substrate 1, the provision of electrodes thereon by vapor-depositing electrode material when the layer is exposed is facilitated by the subsequent polishing of the substrate. In addition to the poor transparency of the substrate, it is impossible to prevent an unnecessary diffusion of the dopant toward the vicinity of the opposite surface of the substrate in the process of diffusion of dopant for the purpose of provision of p-n junction in the region 4 of the layer 2. Therefore, the dopant-diffused portion of the substrate should be at least removed by polishing. Furthermore, if the substrate material is of such as germanium (Ge) or gallium arsenide (GaAs) which is relatively inexpensive and has a poor light transparency, the substrate should be completely removed after the formation of the epitaxial layer of low carrier density to increase the amount of light emitted from the p-n junction which may be used. In the conventional wafer, since the carrier density of surface portion of the epitaxial layer adjacent the substrate is low, it is very difficult to provide ohmic electrodes on that surface portion as mentioned previously. According to the present invention, since the surface portion 3 is of high carrier density, the provision of the electrodes is much facilitated, resulting in an improved yield of diode chips.

For example, when a red light emitting LED of gallium arsenide phosphide (GaAs$_x$P$_{(1-x)}$x≈0.6) is fabricated according to the present invention on the substrate of gallium arsenide which is removed subsequently, the amount of light available for use of 2 to 4 times that obtained by a red LED fabricated according to the conventional method in which the substrate is unremoved.

EXAMPLE 1

A monocrystalline substrate of GaAs having thickness of 296 μm and (100) plane 3° off towards (110) was prepared, through a damage-free mirror polishing, with an n type Si impurity density of $6 \times 10^{16}$ atoms/cc. The GaAs substrate was disposed in a predetermined position in a horizontal type quartz epitaxial reactor which was about 100 cm long and 75 mm inner diameter and in which a quartz boat containing high purity gallium was set. After a flow rate of high purity hydrogen gas as a carrier gas was maintained at 2000 ml/min and temperatures of a region of the reactor in which the quartz boat was disposed and of a region of the reactor in which the substrate was disposed were maintained at 75° C. and 830° C., respectively, an epitaxial growth of a layer of GaAs$_{(1-x)}$Px (x≈0.6) was commenced to form a first epitaxial layer region of high carrier density (n+region) on the substrate by introducing, for 80 minutes and at the rate of 40 ml/min, hydrogen sulfide diluted with nitrogen to 50 ppm, high purity hydrogen chloride gas at 56 ml/min to form GaCl as a result of reaction thereof with gallium contained in the quartz boat arsine (AsH$_3$) diluted with hydrogen gas to 15% by volume, and phosphide (pH$_3$) diluted with hydrogen gas to 15% by volume, with the flow rates of hydrogen arsenide and hydrogen phosphide being varied gradually with time from 200 ml/min to 100 ml/min and from 0 ml/min to 100 ml/min, respectively. As a result, the first epitaxial layer region of GaAs$_{(1-x)}$Px (x=0∼0.6) serving as a compositionally gradient layer was formed.

On the compositionally gradient layer, an epitaxial layer of GaAs$_{(1-x)}$Px having a constant composition layer of x≈0.6 was grown for 380 minutes. For the initial 300 minutes during the period of 380 minutes, the flow rates of hydrogen sulfide, phosphine, arsine and hydrogen chloride were constantly maintained at 40 ml/min, 100 ml/min, 100 ml/min and 56 ml/min, respectively, to form an n+ layer of constant constituent ratio and of high carrier density. For the later 80 minutes during the 380 minute period, the flow rate of hydrogen sulfide was decreased to a rate of 6.5 ml/min to form an n layer of constant constituent ratio and of low carrier density suitable to obtain a desired recombination radiation efficiency of a finally fabricated LED. Simultaneously, for the last 30 minutes in the last 80 minutes period, high purity ammonia (NH$_3$) gas was introduced at 150 ml/min to form a nitrogen-doped n type layer of constant constituent ratio.

The GaAs$_{(1-x)}$Px epitaxial wafer thus prepared was tested for various physical properties thereof.

(A) It was observed that the GaAs$_{(1-x)}$Px epitaxial layer included an n+ type region adjacent the substrate and an n type region. That is, the average carrier densities n$_E$' and n$_E$ of the n region and the n+ region were $4.7 \times 10^{17}$ atoms/ml and $8.3 \times 10^{18}$ atoms/ml, respectively, as measured with the electric capacitance—applied voltage method using a stripping technique of the substrate.

(B) The thickness of the GaAs$_{(1-x)}$Px epitaxial layer thus prepared was 284 μm at a minimum, of which the thicknesses of the n+ layer and the n layer were 240 μm and 44 μm at a minimum, respectively.

Therefore, it was found that when the wafer is thinned by polishing it from the substrate side to form LED chips, the thickness of which may be from 175 to 225 μm, the n+ region suitable for attaching the ohmic electrodes is exposed.

(C) The GaAs$_{(1-x)}$Px epitaxial layer consisted of a lamination of three layer regions, the first region, i.e., the compositionally gradient layer region, being of GaAs$_{(1-x)}$Px with x varying from 0 to 0.61, the second layer region being of GaAs$_{(1-x)}$Px with a constant x=0.61 and the third layer region, i.e., the nitrogen-doped layer region being of GaAs$_{(1-x)}$Px with a constant x=0.61 and having a nitrogen density equal to $2.4 \times 10^{19}$ atoms/ml. These were confirmed by using an X-ray diffraction method, light photoluminescence method and light absorption method. The minimum thicknesses of the first, second and third layer regions were 54 μm, 207 μm and 22 μm, respectively.

Then a red light emitting diode was fabricated by using the wafer prepared through the processes mentioned above.

The wafer and about 100 mg of high purity ZnAs$_2$ were put in a quartz container having an inner volume of about 120 cc and the quartz container was evacuated. The quartz container was put in a thermal diffusion furnace maintained at 730° C. for 80 minutes and, as a result, a p-n junction having junction depth of about 3.7 μm was formed in the third layer region.

The substrate portion of the wafer was removed by polishing it with an alumina powder polishing machine until the thickness became 182 μm. After the polishing, ohmic electrodes of Au-Si type alloy were provided on the polished surface by vapor-deposition with a mask, and electrodes of Au-Zn type alloy on the opposite surface by vapor-deposition with a mask. The resultant diode wafer was sintered in a furnace maintained at 515° C. for 10 minutes under a nitrogen environment. Thus, the diode wafer was cut away by an automatic diamond scriber into a plurality of diode chips each having an area of 350 μm×350 μm. The chips were thermally mounted onto a header (To-18) and then thin Au lead wires were thermally fused to the ohmic electrodes.

Three hundred and fifty (350) diodes thus produced, each being 350 μm in width, 350 μm long and 182 μm thick, emitted lights ranging from 270 μcd to 430 μcd with forward current of 5 mA.

That is, the light emitting diode according to the present invention could output a light 2 to 4 times larger than that of a red LED prepared by the conventional method using a substrate of GaAs and epitaxial layer of GaAs$_{(1-x)}$Px (x≐0.4). The present diode also emitted a light 1.8 to 3.8 times that of a red LED prepared by the conventional method using a substrate of GaAs and epitaxial layer of GaAs$_{(1-x)}$Px (x≐0.6). It was found that these effects of the present invention make the production of highly efficient LEDs possible with the inexpensive GaAs substrate and which have been heretofore impossible without using the expensive GaP substrate. In addition, the forward threshold voltage V$_F$ of the present diode was 1.85 V with a current of 10 mA and the peak wavelength of light and the half value width were 6450Å and about 250 Å, respectively.

EXAMPLE 2

A gallium phosphide substrate having a (100) plane, 5° off towards (110) was cut out by a diamond cutter from a gallium phosphide monocrystalline ingot which has a carrier density of $4.5 \times 10^{17}$ atoms/cm$^3$ and is doped with sulfur as an n-type impurity. After a cleaning process utilizing a conventional organic solvent, the gallium phosphide substrate having an original thickness of about 350 μm was polished to 300 μm thick to remove the distortion.

Twelve (12) gallium phosphide substrates each having an area of about 23.8 cm$^2$ (about 55 mm in diameter) were divided into two groups, mounted on a susceptor made of quartz, and set in a predetermined position within a horizontal type epitaxial reactor made of quartz and having a length of about 96 cm and an inner diameter of 80 mm. After setting the gallium phosphide substrates as mentioned above, argon is introduced into the epitaxial reactor which has a quartz boat containing high purity gallium so as to replace air contained in the reactor with argon. Subsequently, high purity hydrogen gas was introduced into the reactor as a carrier gas for the epitaxial growth process at 2,000 ml per minute. After the supply of argon terminated, the temperature of the reactor was raised so that the gallium-containing quartz boat region and the gallium phosphide substrate-setting region were maintained at the temperatures of 730° C. and 870° C., respectively, and the growth process of a vapor phase epitaxial film consisting of GaAs$_{(1-x)}$Px (where x≐0.65) for amber light emission was initiated. In order to form a high carrier density n+-type region, hydrogen sulfide H$_2$S diluted with nitrogen to 50 ppm was introduced into the reactor at 40 ml per minute after starting the epitaxial growth process. On the other hand, gallium chloride was formed by a reaction of hydrogen chloride gas introduced into the reactor at 70 ml per minute with gallium contained in the quartz boat, and phosphine diluted with hydrogen to 15% was introduced into the reactor at 200 ml per minute. At this time, an initial 10 minute period was taken to grow a gallium phosphide layer homoepitaxially on each of the gallium phosphide substrates, and a subsequent time was taken for a heteroepitaxial growth for the GaAs$_{(1-x)}$Px layer. More specifically, 90 minutes following the aforesaid 10 minutes were taken to form a compositionally graded layer consisting of GaAs$_{(1-x)}$Px by gradually reducing the flow rate of the aforesaid phosphine from 200 ml/min to 112 ml/min and introducing arsine diluted with hydrogen to 15% into the reactor so as to increase gradually from 0 ml to 88 ml per minute, while maintaining the aforesaid hydrogen sulfide and hydrogen chloride at the fixed flow rates of 40 ml/min and 70 ml per minute, respectively. Subsequently, a GaAs$_{(1-x)}$Px layer having a constant composition ratio was grown on the aforesaid graded layer for 120 minutes, thereby having formed a vapor phase epitaxial film consisting of GaAs$_{(1-x)}$Px (where x≐0.65).

In this case, the formation of the latter layer was performed as follows:

An n+-type layer having a constant constituent ratio was formed for the initial 60 minute in the 120 minutes period under the condition of fixed flow ratios of hydrogen sulphide (H$_2$S), phosphine, arsine, and hydrogen chloride at ml 40 ml, 112 ml, 88 ml and 70 ml per minute, respectively. An n-type layer having a constant constituent ratio and having a low carrier density, required for recombination radiation conversion efficiency of a finally fabricated LED was formed during the subsequent 60 minute of the 120 minutes period by reducing only the flow rate of the hydrogen sulfide (H$_2$S) to 7 ml per minute. At this time, a nitrogen-doped n-type layer having a constant composition ratio was formed by introducing high purity ammonia (NH$_3$) into the reactor at 160 ml per minute during the last 40 minutes in the above 60 minute period. Immediately after terminating the GaAs$_{(1-x)}$Px epitaxial film growth process, the temperature of the epitaxial reactor was lowered by stopping the flows of hydrogen sulfide, phosphine, arsine and hydrogen chloride thereinto while keeping only high purity carrier gas flow.

After confirming that the gallium phosphide substrate setting region was cooled to 80° C., argon gas was reintroduced into the reactor and the flow of high purity hydrogen gas was terminated so that hydrogen gas was fully replaced by argon. Then epitaxial wafers were taken out from the epitaxial reactor.

One of two groups each including 6 GaAs$_{(1-x)}$Px epitaxial wafers manufactured as mentioned above were tested.

(a) It was observed that the GaAs$_{(1-x)}$Px epitaxial film comprises an n$^+$-type region having a high carrier density and an n-type region having a low carrier density. In other words, an interface between the n$^+$-type region and the n-type region was observed through a microscope as a clear boundary line. Further, the carrier densities Ne' and Ne of the n$^+$-type and n-type regions were measured by means of the Hall effect and C-V (electric charge-applied voltage) methods as having average values of $2.6 \times 10^{17}$ atoms/ml and $7.4 \times 10^{16}$ atoms/ml, respectively (b) The GaAs$_{(1-x)}$Px epitaxial film had an average thickness of 226 μm at the upstream end area thereof and an average thickness of 109 μm at the downstream end thereof. The n$^+$-type region and the n-type region of the GaAs$_{(1-x)}$Px epitaxial film had average thicknesses of 72 μm and 37 μm, respectively. When the substrate of the wafer was polished to a thickness suitable to that of an LED, the epitaxial layer was exposed and the exposed portion of the layer was the n$^+$-type region suitable for forming an ohmic electrode.

(c) It was observed by the photoluminescence method and light absorbing method that the epitaxial layer comprises a lamination of three layer regions, the first layer region being of GaAs$_{(1-x)}$Px with varying x from 1.0 to 0.66, the second region being of GaAs$_{(1-x)}$Px with constant x=0.66, and the third nitrogen doped region being of GaAs$_{(1-x)}$Px x=0.66, and constant impurity density of $N = 2.2 \times 10^{19}$ atoms/ml. The first, second and third layer regions respectively had average thicknesses of 42 μm, 48 μm and 19 μm at the downstream end area.

Amber LEDs were fabricated as hereinunder described utilizing the remaining group of 6 GaAs$_{(1-x)}$Px epitaxial wafers.

The 6 epitaxial wafers and a high purity zinc arsenide of 250 mg were inserted into a quartz container which was evacuated thereafter. The epitaxial wafers in the quartz container are maintained at 730° C. in a thermal diffusion furnace. As a result, a p-n junction having a depth of about 4.4 μm was formed in the third nitrogen sloped layer. Subsequently, each of the epitaxial wafers in which the p-n junction was formed was polished to the desired thickness of 200 μm using an alumina powder polishing machine. Then as ohmic electrodes, an Au-Si alloy and an Au-Zn alloy were vapor-deposited on the polished surface and on the opposite surface of the epitaxial wafers, respectively, with masks, resulting diodes on wafers were sintered in a furnace with nitrogen gas atmosphere maintained at 520° C. The sintered diode wafers were cut into a plurality of LED chips each having a size of 400 μm by a diamond scriber, and the chips were mounted on a header (TO-5), and provided with aluminum thin lead wires.

The V-I (voltage-current) characteristics of each chip exhibited an excellent forward rising voltage $V_F$ ($V_F = 1.9$ V where current is 10 mA) and the yield of the LEDs from the wafer was excellent.

EXAMPLE 3

A monocrystalline substrate of germanium doped with phosphorus as an n-type impurity with a density of $5 \times 10^{16}$ atoms/ml was prepared by damage free mirror surface polishing and had a thickness of 350 μm and a (100) plane, 2° off towards (110). One surface of the germanium substrate was previously covered by silicon dioxide film and silicon nitride film by means of CVD (chemical vapor deposition) method to avoid autodoping of germanium into an epitaxial layer to avoid formed on the other surface thereof during a subsequent epitaxial growth process. Then, the germanium substrate was set in a predetermined position within a horizontal type epitaxial quartz reactor in which a quartz boat containing high purity gallium is set and which has a length of about 100 cm and an inner diameter of 55 mm. After the gallium-containing quartz boat region and germanium substrate region were maintained at 725° C. and 800° C. respectively, the vapor phase growth process of a Ga As$_{(1-x)}$Px (x $\doteq$ 0.6) epitaxial film was initiated by flowing high purity hydrogen gas into the reactor at 1500 ml per minute as carrier gas, as mentioned in the preceding examples. In order to form a high carrier density region (n$^+$-type region) in the epitaxial layer, after starting the epitaxial growth process, hydrogen sulfide diluted with nitrogen to 50 ppm was introduced into the reactor at 35 ml per minute. On the other hand, a gradient layer of Ga As$_{(1-x)}$Px (x = 0~0.6) was formed by introducing arsine diluted with hydrogen to 15% into the reactor for 80 minutes from the initiation of the epitaxial growth process with flow rate being varied gradually from 200 ml per minute to 100 ml per miute. Simultaneously, high purity hydrogen chloride gas was introduced into the reactor at 35 ml per minute so as to react with gallium contained in the quartz boat resulting in gallium chloride, and phosphine diluted with hydrogen to 15% was introduced into the reactor with the flow rate being varied gradually from 0 ml to 115 ml per minute.

On the compositionally graded layer thus formed, a constant composition layer Ga As$_{(1-x)}$Px(x $\doteq$ 0.6) was grown continuously for 380 minutes. At this time, an n$^+$-type constant composition layer was formed in the initial 30 minutes by maintaining the flow rate of hydrogen sulfide, phosphine, arsine and hydrogen chloride at 35 ml, 115 ml, 100 and 35 ml per minute, respectively. The remaining 80 minutes were taken to form an n-type constant composition layer having a low carrier density suitable for recombination radiation conversion efficiency of a finally fabricated LED by lowering only the flow rate of hydrogen sulfide to 6.5 ml per minute, and at the same time only 30 minutes in the above 80 minutes period were taken to form a nitrogen doped n-type constant layer by introducing a high impurity ammonia into the reactor at 150 ml per minute, whereby a vapor phase epitaxial growth process has been terminated.

Various physical measurements were conducted with respect to the GaAs$_{(1-x)}$Px epitaxial wafer fabricated as mentioned above, and the following results have been found.

(a) It was observed by means of the C-V method with peeling off that the $GaAs_{(1-x)}Px$ epitaxial film comprises an $n^+$-type and an n-type region having average carrier densities $Ne'$ and $Ne$ of $6.5 \times 10^{17}$ atoms/ml and $5.5 \times 10^{16}$ atoms/ml, respectively.

(b) The $GaAs_{(1-x)}Px$ epitaxial film had a minimum thickness of 260 μm, and the $n^+$-type and n-type regions of the epitaxial film had a minimum thickness of 220 μm and 40 μm, respectively. The $n^+$-type region was exposed by polishing it to the desired thickness of 175 to 225 μm which is the thickness suitable for the LED.

(c) According to the X-ray diffractiometry, method photoluminescence method and low temperature light absorbing method, the first compositionally graded layer of the $GaAs_{(1-x)}Px$ epitaxial film had x changing from zero to 0.65, the second constant composition layer thereof had a constant value of $x=0.65$, and the third nitrogen doped constant composition layer had a constant value of $x=0.65$, and $N=2.0 \cdot 10^{19}$ atoms/ml. In this case, the first, second and third layers had minimum thicknesses of 50 μm, 218 μm and 20 μm, respectively.

A red LED was fabricated utilizing the $GaAs_{(1-x)}Px$ epitaxial wafer prepared as mentioned above by removing a low light transparent portion including the starting germanium monocrystalline substrate in the same manner as the first example.

It has been found that each of 120 LEDs thus fabricated (the diode chips each have dimensions of 350 μm wide, 350 μm length long and 180 μm thick) has a light intensity of 230 to 400 μCd at its forward current of 5 mA.

In other words, it has been proved that a LED fabricated in accordance with the present invention has a light intensity about 2 to 4 times larger than that of the prior art $GaAs_{(1-x)}Px$ ($x \doteq 0.4$) red LEDs fabricated utilizing gallium arsenide substrates, and about 1.7 to 3.6 times larger than that of the other prior art $GaAs_{(1-x)}Px$ ($x \doteq 0.6$) red LED fabricated utilizing a gallium arsenide substrate, and can be so fabricated utilizing considerably low cost gallium arsenide substrate as to have substantially the same light intensity as the prior art Led of high light intensity which heretofore has only been fabricable utilizing a comparatively high cost gallium phosphide substrate.

Hence, it has been also found that an LED diode manufactured in accordance with the present invention has a forward threshold voltage $V_F$ of 1.85 V at current of 10 mA and a peak wavelength of 6330 Å.

Various other modifications of the present invention will be apparent to those skilled in the art without departing from the spirit and scope thereof.

What is claimed is:

1. A method of fabricating an electroluminescent device comprising the steps of:

preparing a monocrystalline semiconductor substrate, growing on said substrate a first region of an epitaxial layer of a compound semiconductor material of a high carrier density, continuing to grow said epitaxial layer but with a reduced carrier density to form a second region of said epitaxial layer;

diffusing impurities into said second region of said epitaxial layer having said reduced carrier density to form a p-n junction therein; and polishing said substrate having formed thereon said epitaxial layer having said p-m junction to substantially remove said substrate material to form a diode wafer one surface of which comprises said first region of said epitaxial layer having said high carrier density.

2. A method of fabricating an electroluminescent device as claimed in claim 1, further comprising the steps of vapor-depositing ohmic electrodes on both surfaces of said diode wafer with masks, dividing said diode wafer into a plurality of diode chips, and connecting lead wires to said ohmic electrodes of each of said diode chips.

3. A method of fabricating an electroluminescent device as claimed in claim 1, wherein said semiconductor substrate consists of the elements belonging to groups IIIb and Vb of periodic table and said epitaxial layer consists of elements belonging to the same group of periodic table as those of the elements forming said substrate.

4. A method of fabricating an electroluminescent device as claimed in claim 1, wherein said semiconductor substrate consists of elements belonging to group IV of the periodic table and said epitaxial layer consists of elements belonging to groups IIIb and Vb of the periodic table.

5. A method of fabricating an electroluminescent device as claimed in claim 3, wherein the composition ratios of the elements of said substrate and said epitaxial layer are different.

6. A method of fabricating an electroluminescent device as claimed in claim 5, further comprising the step of varying the composition ratio of said high carrier density region of said epitaxial layer from the ratio of said substrate to the ratio of said reduced carrier density region of said epitaxial layer.

7. A method of fabricating an electroluminescent device as claimed in claim 2, wherein the thickness of said high carrier density region of said epitaxial layer is at least 100 μm.

8. A method of fabricating an electroluminescent device as claimed in claim 2, wherein the carrier density of said high carrier density region of said epitaxial layer is at least $9 \times 10^{16}$ atoms/cm$^3$ and wherein the carrier density of said reduced carrier density region of said epitaxial layer is $9 \times 10^{15}$ atoms/cm$^3$ to $3 \times 10^{17}$ atoms/cm$^3$ and smaller than that of the high carrier density region.

* * * * *